United States Patent
Gilbert et al.

(10) Patent No.: US 6,686,210 B1
(45) Date of Patent: Feb. 3, 2004

(54) METHODS FOR CONTROLLING THE CRYSTALLOGRAPHIC TEXTURE OF THIN FILMS WITH ANISOTROPIC FERROELECTRIC POLARIZATION OR PERMITTIVITY

(75) Inventors: Stephen R. Gilbert, Dallas, TX (US); Theodore S. Moise, Dallas, TX (US); Scott R. Summerfelt, Garland, TX (US)

(73) Assignee: Texas Instruments Incorporated, Dallas, TX (US)

(*) Notice: Subject to any disclaimer, the term of this patent is extended or adjusted under 35 U.S.C. 154(b) by 387 days.

(21) Appl. No.: 09/349,439

(22) Filed: Jul. 9, 1999

(51) Int. Cl.[7] ............... H01L 21/00; H01L 21/8234; H01L 21/8244; H01L 21/336
(52) U.S. Cl. ............... 438/3; 438/238; 438/239; 438/283
(58) Field of Search ............... 438/3, 238, 239, 438/283

(56) References Cited

U.S. PATENT DOCUMENTS

| | | | | |
|---|---|---|---|---|
| 5,146,299 A | * | 9/1992 | Lampe et al. | 357/23.5 |
| 5,390,072 A | * | 2/1995 | Anderson et al. | 361/313 |
| 5,519,234 A | * | 5/1996 | Paz de Araujo et al. | 257/295 |
| 5,638,252 A | * | 6/1997 | Drab et al. | 361/321.1 |

OTHER PUBLICATIONS

S. wolf and R. Tauber, Silicon Processing for the VLSI Era, vol. I p. 1974, 1986.*

* cited by examiner

Primary Examiner—Wael Fahmy
Assistant Examiner—Shrinivas Rao
(74) Attorney, Agent, or Firm—Carlton H. Hoel; W. James Brady; Frederick J. Telecky, Jr.

(57) ABSTRACT

A method for controlling the crystallographic texture of thin films with anisotropic ferroelectric polarization or permittivity by means of ion bombardment resulting in a texture with higher ferroelectric polarization or permittivity which is normally energetically disfavored.

9 Claims, 7 Drawing Sheets

METHODS FOR CONTROLLING THE CRYSTALLOGRAPHIC TEXTURE OF THIN FILMS WITH ANISOTROPIC FERROELECTRIC POLARIZATION OR PERMITTIVITY

BACKGROUND AND SUMMARY OF THE INVENTION

The present invention relates to processes for creating and controlling the crystal texture of thin films with anisotropic ferroelectric polarization or permittivity and to the integrated circuits which include them.

Background: Ferroelectrics

Ferroelectrics are analogous to ferromagnetic materials: just as the ferromagnetic material in a bar magnet can be permanently magnetized by applying a sufficiently strong magnetic field to it, and will thereafter act independently as a magnet, so a ferroelectric can acquire a fixed voltage gradient when a sufficiently strong electric field is applied to it.

Bismuth (Bi) containing ferroelectrics, such as $SrBi_2Ta_2O_9$ (SBT), have attracted considerable attention for use in nonvolatile memories because of their intrinsic low operating field, high switching speed, and excellent endurance. Unlike ferroelectric $Pb(Zr,Ti)O_3$ (PZT), a leading alternative, SBT is essentially free of fatigue (decrease in efficiency) to at least 10 exp 11 cycles even when Pt electrodes are employed. This eliminates the need for conducting oxide electrodes, simplifying capacitor fabrication. Moreover, SBT generally exhibits a smaller coercive voltage then PZT. For these reasons, SBT is a leading contender for the storage cell material in nonvolatile memory devices.

However, SBT (see FIG. 7 for a diagram of an SBT crystal) is one of a general class of bismuth containing ferroelectrics known as Aurivillius compounds. Aurivillius compounds are characterized by a layered perovskite unit cell. A perovskite crystal is the simplest example of a ferroelectric crystal. In a perovskite crystal, not every ion is at a point of full cubic symmetry. (See FIG. 6 for an example of a perovskite structure. Note that every Ba++ and Ti4+ ion is at a point of full cubic symmetry, but that the O− ions are not.) The Aurivillius phases can be represented by the general formula $(Bi_2O_2)2+(A_{m-1}B_mO_{3m+1})2-$, where A can be monovalent, divalent, or trivalent ions present singly or in combination. Examples for A include Na+, K+, Sr2+, Ca2+, Ba2+, Pb2+, Bi3+, etc. The B ion is Ta5+, Ti4+, Nb5+, Mo6+, W6+, Fe3+, etc. or a mixture of them. The quantity m can be an integer or half integer. (See E. C. Subbarao, "A Family of Ferroelectric Bismuth Compounds," 23 J. Phys. Chem. Solids 665 (1962); E. C. Subbarao, "Ferroelectricity in Mixed Bismuth Oxides with Layer-Type Structure," 34 J. Chem. Phys. 695 (1961); E. C. Subbarao, "Ferroelectricity in $Bi_4Ti_3O_{12}$ and Its Solid Solutions," 122 Phys. Rev. 804 (1961); and B. Aurivillius & P. H. Fang, "Ferroelectricity in the Compound $Ba_2Bi_4Ti_5O_{18}$," 126 Phys. Rev. 893 (1962) which are hereby incorporated by reference.) Other ferroelectrics in this family include $SrBi_4Ti_4O_{15}$, $CaBi_2Nb_2O_9$, $Bi_4Ti_3O_{12}$, and solid solutions such as $SrBi_2(Ta_xNb_{2-x})O_9$.

In general, Bi-layered ferroelectrics possess a large polarization along the a-axis, but virtually no polarization along the c-axis, meaning that they have highly anisotropic properties. (An "anisotropic" property of a material is one which depends on the orientation of the material. For example, wood is anisotropic, in that it splits more easily with the grain than across the grain.) Therefore, the ferroelectric properties (spontaneous polarization, coercive field, dielectric constant, etc.) are strongly dependent on the orientation of the films with respect to the underlying substrate materials. For bulk compounds, the major axes are fairly simple to characterize since crystal sections can be cut in such a way as to facilitate the application of high fields along different crystallographic directions. However, the properties in bulk compounds can never be truly replicated in the corresponding thin films. To date, the majority of SBT thin film work indicates a strong tendency towards polycrystalline or c-axis oriented growth, regardless of the electrode employed. Deposition of a-axis oriented SBT has proven to be quite difficult due to the strongly flattened unit cell characteristic of the layered perovskites (for SBT, a=0.38 nm and c=2.51 nm). In order to maximize the ferroelectric properties of SBT thin films, methods must be developed to obtain highly a-axis textured layers.

Aurivillius compounds are not the only ferroelectrics exhibiting anisotropic polarization. Polarization is also anisotropic in ferroelectrics possessing the perovskite structure and the tungsten-bronze structure. Examples of the perovskite structure include $BaTiO_3$, $PbTiO_3$, $Pb(Zr,Ti)O_3$, lanthanum-doped $Pb(Zr,Ti)O_3$, and niobium-doped $Pb(Zr,Ti)O_3$. FIG. 6 depicts a diagram of the crystal structure of $BaTiO_3$. Some examples of the tungsten-bronze compounds are $PbNb_2O_6$, $PbTa_2O_6$, $SrNb_2O_6$, and $BaNb_2O_6$. The most technologically significant example of these compounds, however, is $Sr_xBa_{1-x}Nb_2O_6$.

Therefore, since perovskite and tungsten-bronze structures are anisotropic, a method must also be developed for obtaining perovskite and tungsten-bronze films that are oriented along the direction of maximum polarization. For perovskite materials, the desired orientation depends upon the structure of the film, which depends upon the composition chosen. For compositions within the tetragonal phase, the largest ferroelectric polarization occurs along the c-axis direction. For compositions within the rhombohedral phase, the maximum ferroelectric polarization occurs along the [111] direction. (See C. M. Foster, G. R. Bai, Z. Li, R. Jammy, L. A. Wills, and R. Hiskes, "Properties Variation with Composition of Single-Crystal $Pb(Zr_xTi_{1-x})O_3$ Thin Films Prepared by MOCVD," 401 Mat. Res. Soc. Symp. Proc. 139 (1996); D. J. Wouters, G. Willems, E. G. Lee, and H. E. Maes, "Elucidation of the Switching Processes in Tetragonal PZT by Hysteresis Loop and Impedance Analysis," 15 Integrated Ferroelectrics 79 (1997); and K. G. Brooks, R. D. Klissurska, P. Moeckli, and N. Setter, "Influence of Texture on the Switching Behavior of $Pb(Zr_{0.70}Ti_{0.30})O_3$ Sol-Gel Derived Thin Films," 12 J. Mater. Res. 531 (1997) which are hereby incorporated by reference.)

Background: Permittivity

Ferroelectrics are not the only materials exhibiting anisotropic crystal structures. Many dielectrics also exhibit anisotropic crystal structures resulting in highly anisotropic permittivities. Materials with high permittivities are useful for standard capacitor elements: a capacitor with a given capacitance can be constructed with a smaller electrode plate area, by using a dielectric with a high permittivity rather than one with a lower permittivity. Therefore, orienting the dielectric film such that the permittivity is maximized is very important.

Background: Ion-bombardment and Film Orientation

One method of texture control is ion-bombardment. Accelerated ions disturb solids within a shallow layer defined approximately by the depth of their penetration. Therefore ion beams may induce drastic changes in the structure of thin solid films which could acquire new physical properties.

It has been shown that ion bombardment during thin film growth can modify the structure, chemistry, and physical properties of the layers as they are deposited. (See F. Adibi et al., "Effects of High-Flux Low-Energy (20–100 ev) Ion Irradiation During Deposition on the Microstructure and Preferred Orientation of Ti0.5A10.5N Alloys Grown by Ultra High-Vacuum Reactive Magnetron Sputtering," 73 J. Appl. Phys. 8580, (1993) which is hereby incorporated by reference.)

Innovative Structures and Methods

The present application discloses a method that allows for precise control of the crystallographic orientation of ferroelectric thin films on a variety of electrodes, resulting in optimal ferroelectric properties by use of ion bombardment to nucleate growth of the proper oriented layer. For maximum polarization, an Aurivillius compound, such as SBT, must be oriented such that the a-axis points at a right angle away from the surface of the film as shown in FIG. 8a and a perovskite compound, such as PZT, must be oriented such that the c-axis points at a right angle away from the surface of the film as shown in FIG. 8b. In a specific example, SBT thin films have been grown with an a-axis orientation as shown in FIG. 8a using the disclosed method.

The present application also discloses a method that allows for the precise control of the crystallographic orientation of dielectric thin films on a variety of electrodes, resulting in films exhibiting the largest possible permittivity. Applications which would benefit from these films include dynamic random access memories (DRAMs), and on-chip capacitors for RF devices. Examples of on-chip capacitors for RF applications include bypass, decoupling, tunable, and switched filter capacitors.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Definitions:

Ferroelectrics: The materials which are known as ferroelectrics are extremely varied, but they have certain properties in common. As the name suggests, ferroelectrics are like electrical analogs to the magnetic properties of ferromagnetic substances. One property which all ferroelectrics possess is that of having a permanent electrical polarization.

Figure 5:
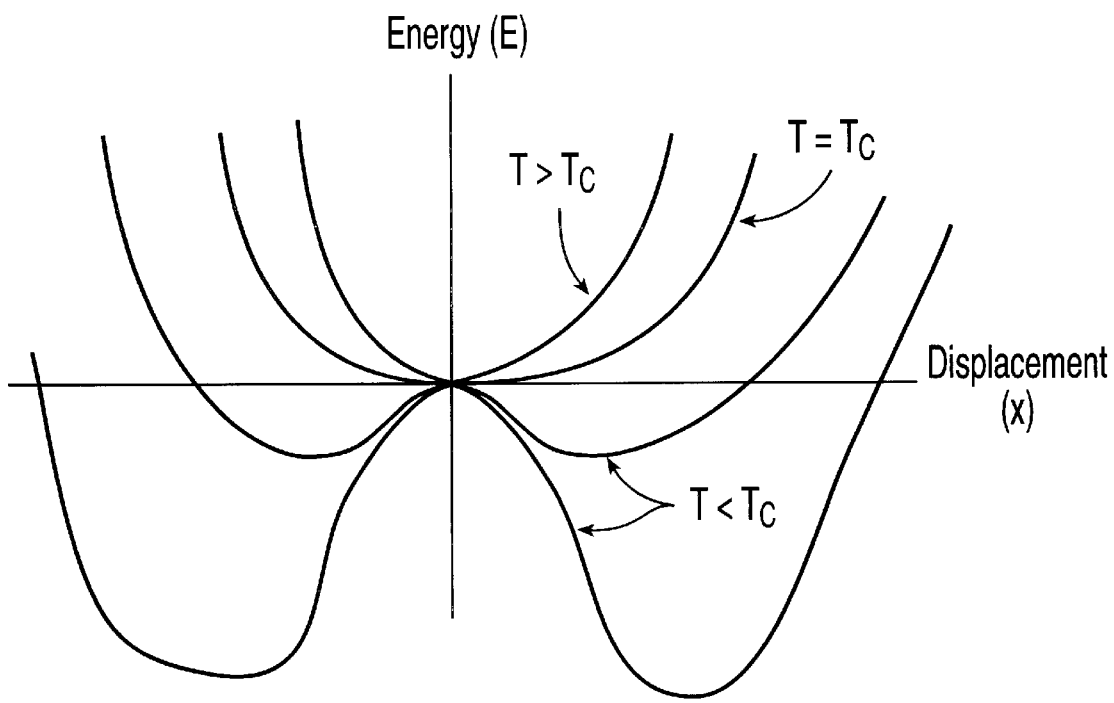
FIG. 5 shows a diagram of energy (E) of a ferroelectric as a function of displacement (x), for several values of the temperature, both above and below the critical temperature Tc.
Figure 6:
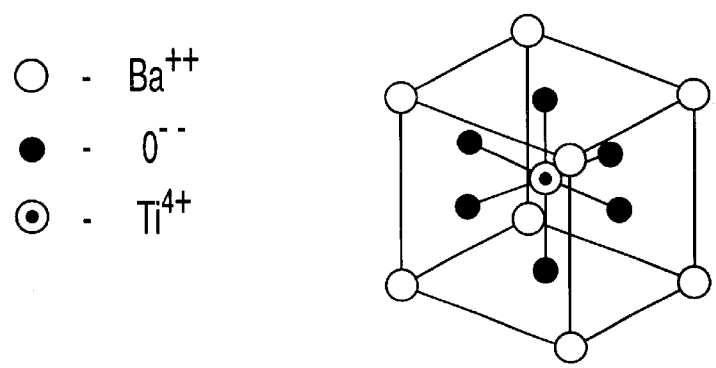
FIG. 6 is a diagram of the crystal structure of BaTiO3.
Figure 7:
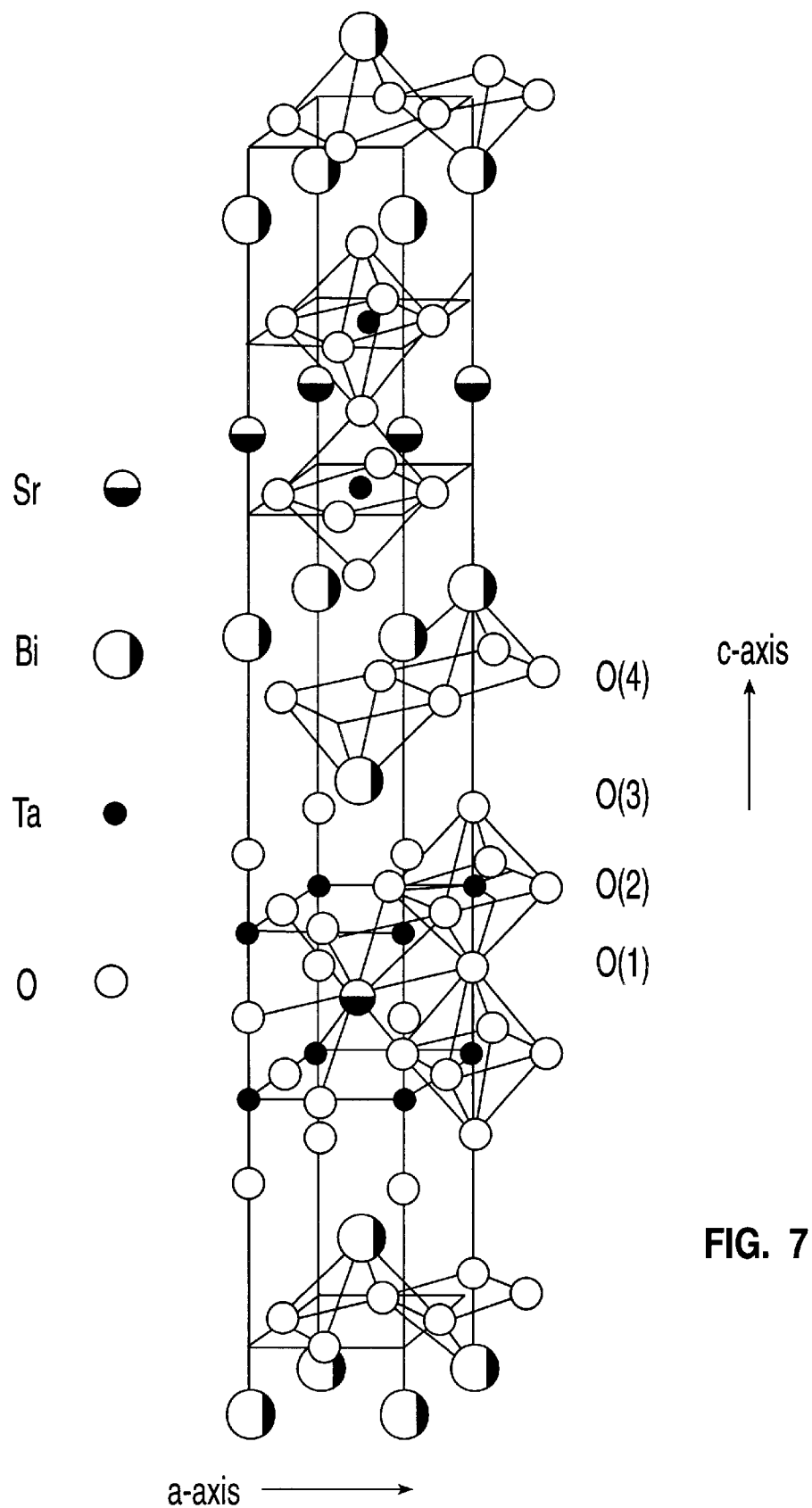
FIG. 7 is a diagram of the crystal structure of SBT.
Figure 8A:
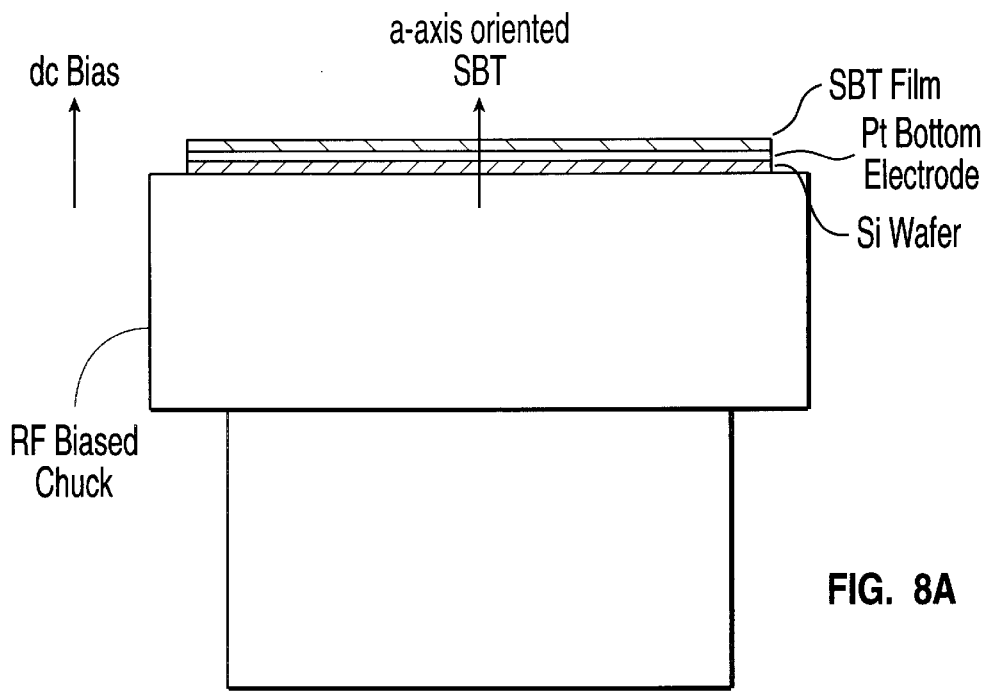
FIG. 8a is a diagram of the orientation of SBT after performing the described process.
Figure 8B:
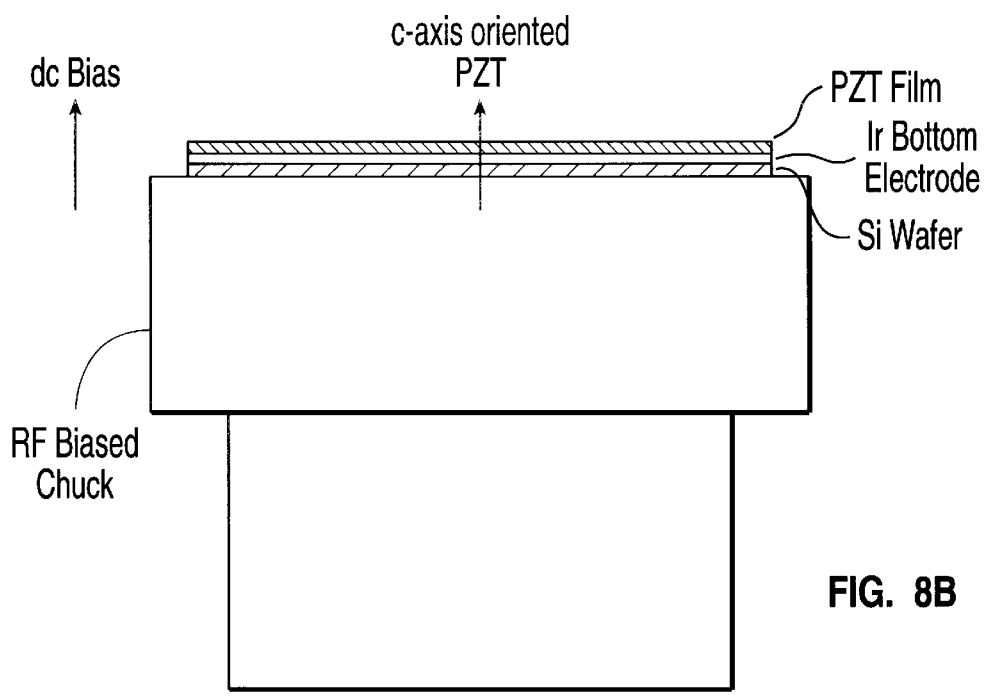
FIG. 8b is a diagram of the orientation of PZT after performing the described process.

A second property which is found in ferroelectrics is that as the temperature increases, the magnitude of the permanent polarization decreases, until finally at a critical temperature (curie temperature) it disappears. The permanent polarization is the product of the displacement of the ions, times the charge carried by an ion. In the simple model of two potential minima, the displacement is the distance from the unstable potential maximum between the two potential minima, to one of the potential minima. The minima move together as the temperature increases, coalescing at the critical temperature. FIG. 5 illustrates a family of curves of this type.

Hysteresis: Hysteresis is another phenomenon which exists below the critical temperature. At these lower temperatures the system will be in one or the other of the minima; the question of which minimum it is in will depend on its past history. Suppose it is in the left-hand minimum. After applying a field, leading to the term -Ax in the energy, the right-hand minimum is lowered and the left-hand one is raised. Eventually a high enough field will be reached so that the left-hand minimum will rise above the maximum at the center of the diagram. Here the point representing the system will slide over from the left-hand minimum. In other words, the polarization has reversed. To go back to the original situation, we must apply a field in the opposite direction, which must now reach the same threshold just described, in order that the right-hand minimum should be raised above the maximum at the center of the diagram.

Texture: Texture is the crystallographic alignment of the grain structure in a polycrystalline solid. Although grain alignments will differ slightly through a film, the predominate grain alignment defines the texture of the film Texture Control Texture control of highly anisotropic dielectric thin films may be achieved by applying an electric bias to the wafer during film growth. The electric field may be DC and/or RF and it may be applied for the entire duration of film growth or it may be applied for only part of the film growth period.

When a bias is applied to the substrate, ions in the plasma are accelerated towards the film surface. The transition to different orientations with increasing applied bias is governed by the energy of ions bombarding the film. In general, the growth of lattice planes possessing the most open structure is favored under these conditions since they are subjected to the least ion-induced distortion. This is the mechanism by which the SBT film orientation can be controlled.

Generalized Ferroelectric Capacitor Process Flow

Figure 1:
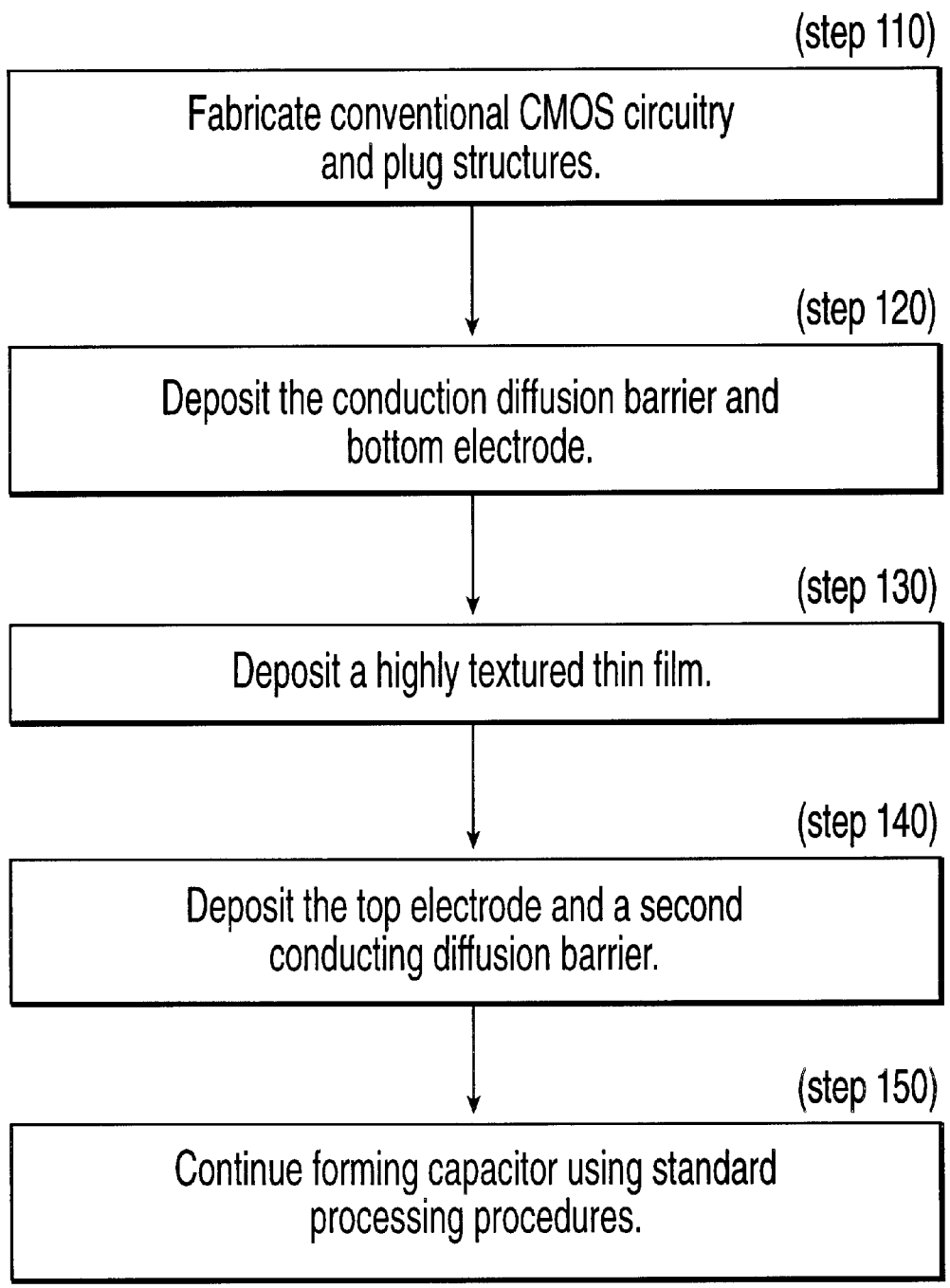
FIG. 1 is a process flow chart for the preferred embodiment.
Figure 4A:
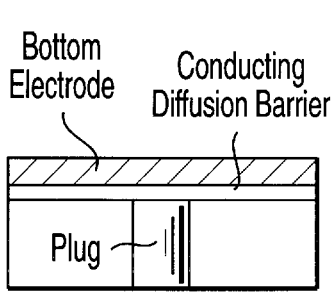
FIGS. 4a–i show the fabrication of a capacitor at various stages in the process.

A generalized process flow suitable for fabricating a ferroelectric capacitor cell is illustrated schematically in FIG. 1, and is outlined below. The starting point for the process is to fabricate conventional CMOS circuitry and plug structures (tungsten (W) or poly-silicon), and planarize using conventional silicon processing technologies (step 110). Sputter deposit the conducting TiAlN diffusion barrier (step 120). Next, sputter deposit the bottom platinum (Pt) electrode (step 120) (see FIG. 4(a) for a diagram of the structure). Follow this step by depositing a highly textured SBT ferroelectric thin film (step 130) by MOCVD, as described below (see FIG. 4(b)). Next deposit the top Pt electrode (step 140) (see FIG. 4(c)) and sputter deposit a TiAlN conducting diffusion barrier (step 140). Continue fabricating the capacitor using standard processing steps (step 150) by first performing photolithography (see FIG. 4(d)) using the capacitor pattern. Etch the entire capacitor stack (see FIG. 4(e)), stopping on the underlying interlayer dielectric. Remove any remaining photoresist using an ash process. Deposit the TiO2 sidewall diffusion barrier. Next, remove the TiO2 sidewall barrier from planer surfaces, deposit an interlayer dielectric (see FIG. 4(f)), and perform photolithography using the via pattern (see FIG. 4(g)). Etch the vias and deposit the metallization (see FIG. 4(h)) where the preferred metallization is a TiN/Al/TiN multilayer. Finally, perform photolithography using the metallization pattern and etch the TiN/Al/TiN/Ti stack (see FIG. 4(i)).

Figure 2:
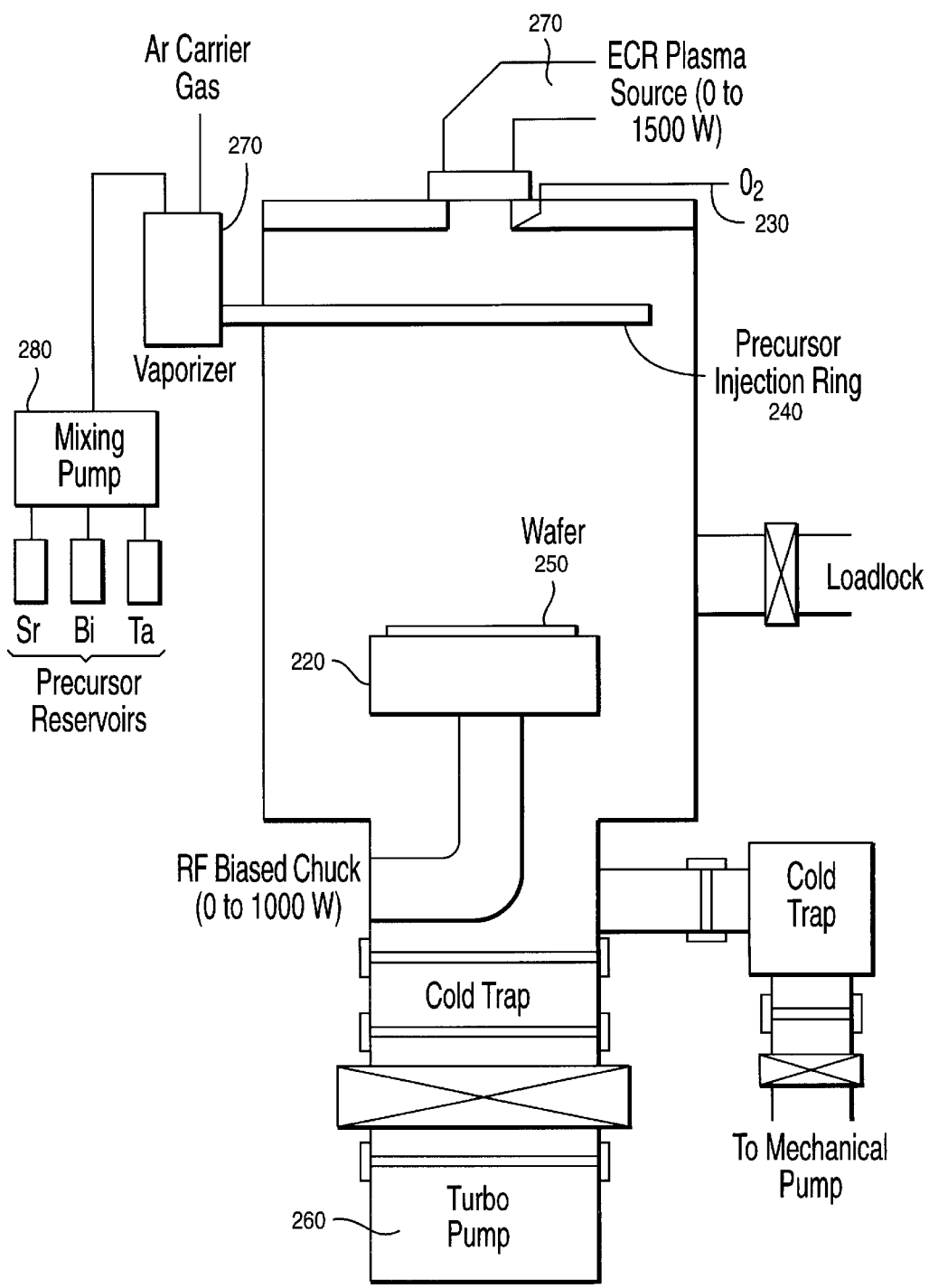
FIG. 2 is a schematic diagram of an electron cyclotron resonance (ECR) plasma-enhanced reactor and precursor delivery system suitable for growing textured SBT.

Preferred Embodiment: Textured SBT by Plasma-Enhanced Metalorganic Chemical Vapor Deposition In the preferred embodiment, the thin film is deposited by plasma-enhanced metalorganic chemical vapor deposition (MOCVD) (step 130). A schematic diagram of an electron cyclotron resonance (ECR) plasma-enhanced reactor and precursor delivery system suitable for growing textured SBT is shown in FIG. 2. The reactor possesses a vertical-flow, hot-walled configuration. Process gases are introduced at the top of the reactor and exhausted through a pressure control valve at the chamber bottom by a turbomolecular pump 260. Oxygen is supplied through the chamber lid 230 and the metalorganic precursors are delivered through a gas dispersal ring 240 located several inches above the wafer. To avoid condensation or premature decomposition of the metalorganic precursors, the chamber walls and injection ring 240 are maintained between 180 and 220 degrees celsius using recirculating oil as a heat transfer medium. The substrate temperature is controlled by a resistively heated chuck 220, and is calibrated using an instrumented Pt/SiO2/ Si wafer. The maximum chuck 220 heater temperature is 650 degrees celsius, which results in a wafer temperature of around 500 degrees celsius. A 2.45 gigahertz microwave generator feeds microwave power into the reactor through a quartz window located in the chamber lid, exciting an ECR plasma. Magnets positioned around the chamber create the static magnetic field necessary for establishing resonance. All of the process gases, including the precursors and the oxygen, are subjected to direct plasma excitation from the ECR plasma source 210. A DC bias may also be applied through the chuck, which is coupled to a 100 kilohertz radio frequency (RF) generator. A driving frequency of 13.56 megahertz can also be employed.

A Sr(thd)2 metalorganic precursor is delivered to the chamber using an Advanced Technology Materials (ATMI) LDS-300B liquid delivery system (LDS). Sr bis(2,2,6,6-tetramethyl-3,5-heptanedionate)-pentamethyldiethylenetriamine adduct [Sr(thd)2-polyamine], triphenylbismuth [Bi(C6H5)3], and tantalum tetra(isopropoxide)-(2,2,6,6-tetramethyl-3,5-heptanedionate) [Ta(O-iC3H7)4(thd)] are dissolved in a high vapor pressure solvent, n-butyl acetate in this case, to form separate strontium (Sr), bismuth (Bi), and tantalum (Ta) solutions. A precision micropump 280 in the LDS mixes the solutions to the desired ratios. The precursor solution is delivered at a constant rate to a heated porous matrix 270, or frit, where it is flash vaporized. An inert gas (Ar) carries the source vapor into the MOCVD chamber through four nozzles located in the heated gas dispersal ring 240. Optimal SBT properties are generally obtained for films that are slightly rich in Bi and deficient in Sr.

Figure 4B:
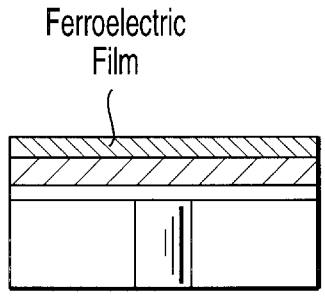
Figure 4C:
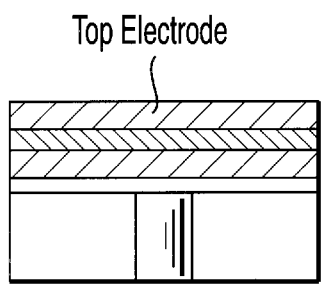
Figure 4D:
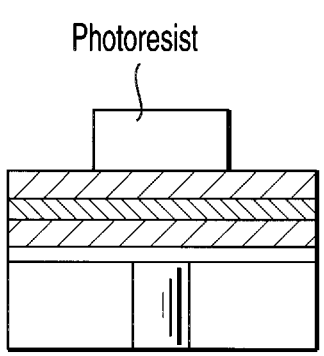
Figure 4E:
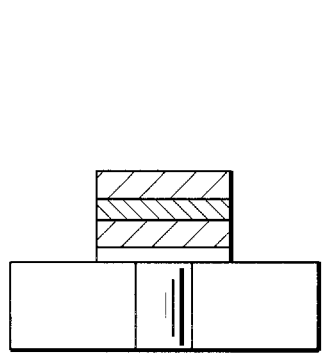
Figure 4F:
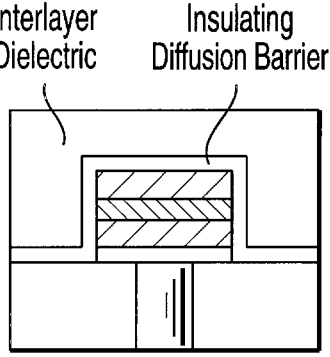
Figure 4G:
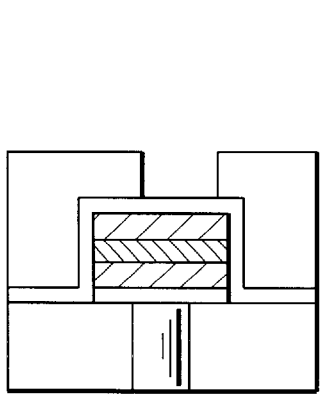
Figure 4H:
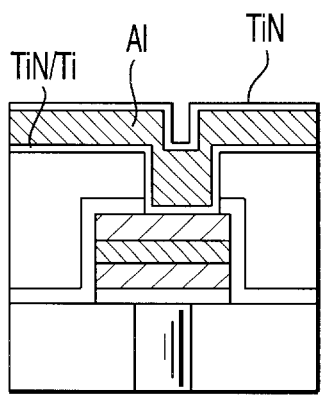
Figure 4I:
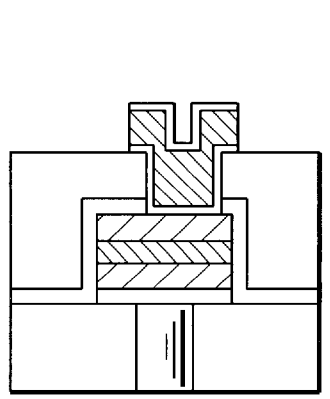

The films are deposited at a substrate temperature of 500 degrees celsius on a Pt/TiAlN bottom electrode stack, which is deposited over tungsten (W) plugs (see FIG. 4b). Using an ECR plasma-enhanced process, the Aurivillius phase can be stabilized in-situ, without a post deposition anneal. For a discussion regarding the deposition of SBT using a plasma-enhanced MOCVD process see N. J. Seong, S. G. Yoon, and S. S. Lee, "Characterization of SrBi2Ta2O9 Ferroelectric Thin Films Deposited at Low Temperatures by Plasma-Enhanced Metalorganic Chemical Vapor Deposition," 71 Appl. Phys. Lett. 81 (1997) which is hereby incorporated by reference.

Alternative Embodiment: Two-step Plasma Enhanced MOCVD

In an alternate embodiment, the RF bias is employed only for the thin buffer layer. The thin buffer acts as a seed layer that enhances the texture of the ma in dielectric layer. The remainder of the film is deposited under the same conditions as the buffer layer except that the RF bias is removed.

Alternative Embodiment: Textured SBT by Thermal MOCVD

Figure 3:
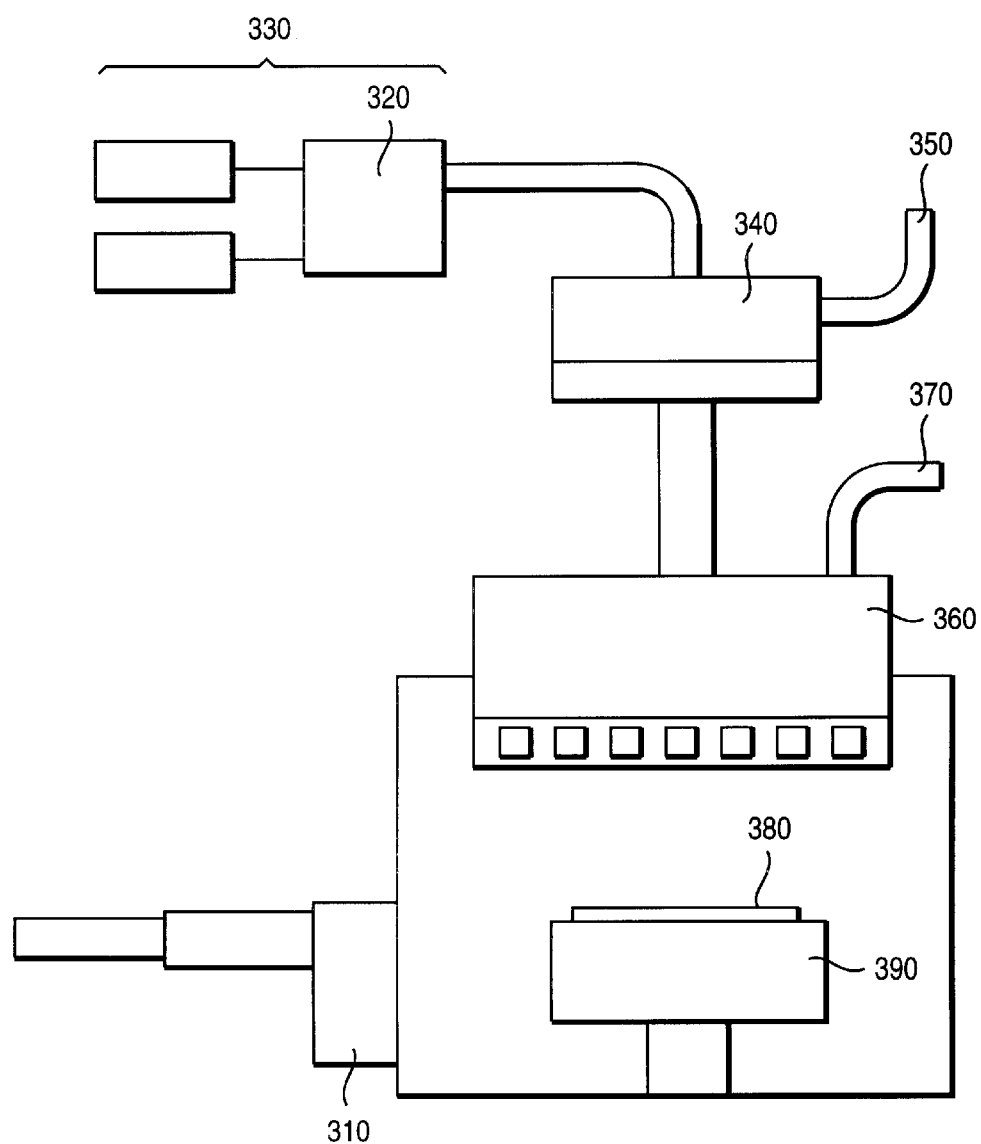
FIG. 3 is a schematic diagram of a thermal MOCVD reactor and precursor delivery system suitable for growing SBT.

In an alternate embodiment, the deposition of textured SBT (step 130) is made by thermal MOCVD. A schematic diagram of a thermal MOCVD reactor and precursor delivery system suitable for growing SBT is shown in FIG. 3. The reactor possesses a vertical-flow, hot-walled configuration. Process gases are introduced at the top of the reactor and exhausted through a pressure control valve 310 at the chamber bottom by a turbomolecular pump. An Sr(thd)2 metalorganic precursor is delivered to the chamber using an ATMI LDS-300B liquid delivery system (LDS) 330. Sr bis(2,2,6,6-tetramethyl-3,5-heptanedionate)-pentamethyldiethylenetriamine adduct [Sr(thd)2-polyamine], triphenylbismuth [Bi(C6H5)3], and tantalum tetra(isopropoxide)-(2,2,6,6-tetramethyl-3,5-heptanedionate) [Ta(O-iC3H7)4(thd)] are dissolved in a high vapor pressure solvent, n-butyl acetate in this case, to form separate strontium (Sr), bismuth (Bi), and tantalum (Ta) solutions. A precision micropump 320 in the LDS mixes the solutions to the desired ratios. The precursor solution is delivered at a constant rate to a heated porous matrix 340, or frit, where it is flash vaporized. An inert gas 350, argon (Ar), carries the source vapor into the MOCVD chamber through a series of nozzles arranged in a showerhead configuration 360. Immediately before entering the chamber, the precursors are mixed with the O2 and N2O oxidizers 370 to provide uniform dispersal of process gases above the wafer. To avoid condensation or premature decomposition of the metalorganic precursors, the chamber walls and showerhead are maintained between 180 and 220 degrees celsius using recirculating oil as a heat transfer medium. In addition, the showerhead is constructed with aluminum (Al) to achieve optimum temperature uniformity. The silicon wafer 380 is placed on a chuck 390 positioned several millimeters below the showerhead, and is heated resistively. A DC bias is applied to the wafer through the chuck 390, which is coupled to a 100 kilohertz RF generator. A driving frequency of 13.56 megahertz may also be employed.

For this process, the wafer temperature is 700 degrees celsius and the total pressure is between 1.0 and 2.0 Torr.

The oxygen (O2) flow is 1000 sccm, the N2O flow is 1000 sccm, and the argon (Ar) carrier gas flow is 200 sccm. The chuck 390 bias is between 50 and 300 volts and the precursor solution flow rate is between 0.10 and 0.15 cc/minute. The films are deposited on a Pt/TiAlN bottom electrode stack, which is deposited over tungsten (W) plugs (see FIG. 4). Optimal SBT properties are generally obtained for films that are slightly rich in Bi and deficient in Sr.

To insure that the Aurivillius phase of SBT is obtained, the films may be deposited at low temperature (about 400 to 550 degrees celsius) to obtain the fluorite phase of SBT first. This is then followed by an anneal in oxygen (O2) between 700 and 800 degrees celsius to stabilize the ferroelectric Aurivillius phase. For further discussion regarding the deposition of SBT by thermal MOCVD and the stabilization of the Aurivillius phase, see T. Ami, K. Hironaka, C. Isobe, N. Nagel, M. Sugiyama, Y. Ikeda, K. Watanabe, A. Machida, K. Miura, and M. Tanaka, "Preparation and Properties of Ferroelectric SrBi2Ta2O9 Films for FeRAM Using Flash-MOCVD," 415 Mater. Res. Soc. Symp. Proc. 195 (1996); C. Isobe, et al., "Characteristics of Ferroelectric SrBi2Ta2O9 Thin Films Grown by 'Flash' MOCVD," 14 Integrated Ferroelectrics 95 (1997); Y. Zhu, S. B. Desu, T. Li, S. Ramanathan, and M. Nagata, "SrBi2Ta2O9 Thin Films Made by Liquid Source Metal-Organic Chemical Vapor Deposition," 12 J. Mater. Res. 783 (1997); T. Li, Y. Zhu, S. B. Desu, C. H. Peng, M. Nagata, "Metalorganic Chemical Vapor Deposition of Ferroelectric SrBi2Ta2O9 Thin Films," 68 Appl. Phys. Lett. 616 (1996), T. Li, R. A. Stall, Y. Zhu, S. B. Desu, C. H. Peng, "Ferroelectric SrBi2Ta2O9 Thin Films Made by One and Two Step Metalorganic Chemical Vapor Deposition," 3008 SPIE 365 (1997); N. J. Seong, S. G. Yoon, and S. S. Lee, "Characterization of SrBi2Ta2O9 Ferroelectric Thin Films Deposited at Low Temperatures by Plasma-Enhanced Metalorganic Chemical Vapor Deposition," 71 Appl. Phys. Lett. 81 (1997); and T. Noguchi, T. Hase, and Y. Miyasaka, "Analysis of the Dependance of Ferroelectric Properties of Strontium Bismuth Tantalate (SBT) Thin Films on the Composition and Process Temperature," 35 Jpn. J. Appl. Phys. 4900 (1996) which are hereby incorporated by reference.

Alternative Embodiment: Textured PZT by Thermal MOCVD

In an alternate embodiment, a PZT thin film is deposited using a thermal MOCVD (step 130). The chamber and precursor delivery method are identical to that shown in FIG. 3. For a discussion of deposition of PZT by MOCVD, see Y. Gao, G. Bai, K. L. Merkle, H. L. M. Chang, and D. J. Lam, "Effects of substrate Orientation and Cooling Rate on Microstructure of PbTiO3 Thin Films Grown by Metalorganic Chemical Vapor Deposition," 245 Thin Solid Films 86 (1993); T. Katayama, M. Shimizu, and T. Shiosaki, "Switching Kinetics of Pb(Zr,Ti)O3 Thin Films Grown by Chemical Vapor Deposition," 32 Jpn. J. Appl. Phys. 3943 (1993); S. Hazumi, T. Asano, M. Hattori, H. Nakashima, I. Kobayashi, and M. Okada, "Effect of substrate Temperature on Electrical characteristics of (Pb,La)(Zr,Ti)O3 Ultrathin Films deposited by Metalorganic Chemical Vapor Deposition," 34 Jpn. J. Appl. Phys. 5086 (1995); T. Y. Kim, D. Kim, and C. W. Chung, "Effects of Oxide Electrodes on PbZrxTi1−xO3 Thin Films Prepared by Metalorganic Chemical Vapor Deposition," 36 Jpn. J. Appl. Phys. 6494 (1997); J. S. Shin & W. J. Lee, "(Pb,La)(Zr,Ti)O3 Thin Films Prepared by electron cyclotron Resonance Plasma Enhanced Chemical Vapor Deposition for the Charge Storage Capacitor of Gigabit-Scale Dynamic Random Access Memory," 37 Jpn. J. Appi. Phys. 198 (1998); P. C. VanBuskirk, M. W. Russell, S. T. Johnston, and S. M. Bilodeau, "CVD of Thin Perovskite Films," Proceedings of the 8th US-Japari Symposium on Dielectrics and Piezoelectrics, Plymouth, Mass. (1997); P. C. VanBuskirk, J. F. Roeder, S. M. bilodeau, M. W. Russell, S. T. Johnston, R. Carl, D. Desrochers, T. Baum, B. Hendrix, and F. Hintermaier, "Common and Unique Aspects of Perovskite Thin Films CVD Processes," 10th International symposium on Integrated Ferroelectrics, March 2–4, 1998, Monterey, Calif., to be published in Int. Ferroelectrics; and C. M. Foster, G. R. Bai, Z. Li, R. Jammy, L. A. Wills, and R. Hiskes, "Properties variation with Composition of Single-Crystal Pb(ZrxTi1−x)O3 Thin Films Prepared by MOCVD," 401 Mat. Res. Soc. Symp. Proc. 139 (1996) which are hereby incorporated by reference.

Metalorganic precursors are also delivered to the chamber using an ATMI LDS-300B liquid delivery system (LDS), as illustrated in FIG. 3. Pb bis(2,2,6,6-tetramethyl-3,5-heptanedionate)-pentamethyldiethylenetriamine adduct [Pb(thd)2-polyamine], zirconium bis(isopropoxy)bis(2,2,6,6-tetramethyl-3,5-heptanedionate) [Zr(O-i-Pr)2(thd)2], and titanium bis(isopropoxy)bis(2,2,6,6-tetramethyl-3,5-heptanedionate) [Ti(O-i-Pr)2(thd)2] are dissolved in a high vapor pressure solvent, n-butyl acetate in this case, to form separate lead (Pb), zirconium (Zr), and titanium (Ti) solutions. A Pb(thd)2 metalorganic precursor is employed for PZT deposition.

The films are deposited at a substrate temperature of 560 to 610 degrees celsius on an Ir/TiAlN stack, which is deposited over tungsten (W) plugs (see FIG. 4). The total pressure is between 1.0 and 2.0 Torr. The oxygen (O2) flow is 1000 sccm, the N2O flow is 1000 sccm, and the argon (Ar) carrier gas flow is 200 sccm. The chuck bias is between 50 and 300 volts and the precursor solution flow rate is between 0.10 and 0.15 cc/minute.

Alternate Embodiment: Sputter Deposition of Thin Films

In an alternative embodiment, the thin film is deposited using a sputter method (step 130).

Alternate Embodiment: Pulsed Laser Deposition of Thin Films

In an alternative embodiment, the thin film is deposited using a pulsed laser deposition process (step 130).

Alternate Embodiment: Non-ferroelectric Perovskites

In alternative embodiments, SBT and PZT can be replaced with a non-ferroelectric perovskite to maximize permittivity.

Alternate Embodiment: Tungsten-bronze Materials

In alternative embodiments, SBT and PZT can be replaced by a tungsten-bronze compound.

According to a disclosed class of innovative embodiments, there is provided: a method of forming dielectric layers, comprising the action of: (a.) depositing a thin film of a dielectric material with a highly anisotropic dielectric property onto a surface, while (b.) applying ion bombardment during at least a part of said depositing step, in order to form said film with a crystallographic texture which is energetically disfavored in the absence of said ion bombardment.

According to another disclosed class of innovative embodiments, there is provided: a method of forming dielectric layers, comprising the action of: (a.) depositing a desired compound onto a surface, by inducing decomposition of precursor materials in proximity to said surface, and (b.) in addition to said step (a.), also applying an electric field at said surface to induce said desired compound to form with a desired orientation which would not form without said electric field.

According to another disclosed class of innovative embodiments, there is provided: a method of forming dielectric layers, comprising the action of depositing a thin film of a dielectric material with a highly anisotropic ferroelectric polarization onto a surface from the vapor phase, while applying an RF bias to said surface.

According to another disclosed class of innovative embodiments, there is provided: a method of forming dielectric layers, comprising the action of depositing a thin film of a dielectric material with a highly anisotropic permittivity onto a surface from the vapor phase, while applying an RF bias to said surface.

According to another disclosed class of innovative embodiments, there is provided: a thin film comprising a ferroelectric with anisotropic polarization oriented such that the axis of maximum polarization points in a direction ninety degrees away from the plane of the surface of said thin film.

According to another disclosed class of innovative embodiments, there is provided: a thin film comprising a dielectric with anisotropic permittivity oriented such that the axis of maximum permittivity points in a direction ninety degrees away from the plane of the surface of said thin film.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

It should be noted that SBT may be replaced by any Aurivillius, perovskite, or tungsten-bronze material. Furthermore, SBT can be replaced by a dielectric with anisotropic permittivity for fabricating standard capacitors.

It should also be noted that other metalorganic precursors suitable for the deposition of SBT thin films include Sr(thd)2-poly-amine, Sr(thd)2,-tetraglyme, Sr(hfa)2-tetraglyme, Sr[Ta(OR)6]2, Bi(Ph)3, Bi(thd)3, Ta(O-i-Pr)(thd)4, Ta(OEt)5, and Sr[Ta(OR)6]2. It should also be noted that other metalorganic precursors suitable for the deposition of PZT thin films include Pb(Et)4, Pb(Et)3O-t-pentyl, Zr(thd)4, Zr(O-t-Bu)4, Zr(O-i-Pr)2(thd)2, Ti(O-i-Pr)2(thd)2, Ti(O-iPr)4, and Ti—O(thd)2. Furthermore, it should be noted that other metalorganic precursors suitable for the deposition of BST thin films include Ba(thd)2-tetraglyme, Ba(thd)2-polyamine, Ba(hfa)2-tetraglyme, Sr(thd)2, Sr(thd)2-polyamine, Sr(thd)2-tetraglyme, Sr(hfa)2-tetraglyme, Ti(O-i-Pr)2(thd)2, Ti(O-i-Pr)4, and Ti—O(thd)2.

It should also be noted that other sidewall spacers may be used instead of TiO2. These include, but are not limited to, TiO2, Al2O3, ZrO2, Ta2O5, (Ba,Sr)TiO3, Si3N4, AlN, SiC, or multilayer combinations.

What is claimed is:

1. A method of forming dielectric layers, comprising the action of depositing a thin film of a dielectric material with an anisotropic ferroelectric polarization onto a surface from the vapor phase, while applying an RF bias to said surface diring a first portion of said depositing and removing said RF bias during a second portion of said depositing.

2. A method of forming dielectric layers, comprising the action of depositing a thin film of a dielectric material with an anisotropic permittivity onto a surface from the vapor phase, while applying an RF bias to said surface diring a first portion of said depositing and removing said RF bias during a second portion of said depositing.

3. A method of depositing a film of a dielectric material, comprising:
   (a) providing precursors, including metal organic compounds, in a chamber;
   (b) activating said precursors with a plasma;
   (c) reacting said activated precursors on a substrate in said chamber with an applied bias to form a first subfilm of a dielectric material; and
   (d) further reacting said activated precursors on said substrate after removal of said applied bias to form a second subfilm of said dielectric material on said first subfilm.

4. The method of claim 3, wherein:
   (a) the dielectric material has a ferroelectric polarization which varies by more than 3:1 in dependence on orientation.

5. The method of claim 3, wherein:
   (a) the dielectric material has a permittivity which varies by more than 3:1 in dependence on orientation.

6. The method of claim 3, wherein:
   (a) the dielectric material is a layered Aurivillius material.

7. The method of claim 3, wherein:
   (a) the dielectric material is a perovskite material.

8. The method of claim 3, wherein:
   (a) the dielectric material is a tungsten-bronze material.

9. A method of depositing a film of a dielectric material, comprising:
   (a) providing precursors, including metal organic compounds, in a chamber;
   (b) thermally activating said precursors;
   (c) reacting said activated precursors on a substrate in said chamber with an said applied bias to form a first subfilm of a dielectric material; and
   (d) further reacting said activated precursors on said substrate after removal of said applied bias to form a second subfilm of said dielectric material on said first subfilm.

* * * * *

UNITED STATES PATENT AND TRADEMARK OFFICE
CERTIFICATE OF CORRECTION

PATENT NO.     : 6,686,210 B1
DATED          : February 3, 2004
INVENTOR(S)    : Stephen R. Gilbert, Theodore S. Moise, Scott R. Summerfelt It is certified that error appears in the above-identified patent and that said Letters Patent is hereby corrected as shown below:

Title page,
Item [60], Related U.S. Application Data should read
-- Provisional Application No. 60/092,172 filed 07/09/1998. --

Signed and Sealed this

Third Day of August, 2004

JON W. DUDAS
*Acting Director of the United States Patent and Trademark Office*